(12) United States Patent
York (10) Patent No.: US 7,012,483 B2
(45) Date of Patent: Mar. 14, 2006

(54) TUNABLE BRIDGE CIRCUIT (75) Inventor: Robert A York, Santa Barbara, CA (US)

(73) Assignee: Agile Materials and Technologies, Inc., Goleta, CA (US)

( * ) Notice: Subject to any disclaimer, the term of this patent is extended or adjusted under 35 U.S.C. 154(b) by 70 days.

(21) Appl. No.: 10/825,809

(22) Filed: Apr. 16, 2004

(65) Prior Publication Data

US 2004/0207486 A1 Oct. 21, 2004

Related U.S. Application Data (60) Provisional application No. 60/464,675, filed on Apr. 21, 2003.

(51) Int. Cl.
H03H 7/01 (2006.01)
H03H 7/075 (2006.01)

(52) U.S. Cl. ........................................ 333/171; 333/174
(58) Field of Classification Search ......... 333/170–172, 333/174, 205, 235; 334/78
See application file for complete search history.

(56) References Cited

U.S. PATENT DOCUMENTS 5,574,413 A * 11/1996 Ruelke ........................ 333/174
6,441,701 B1 * 8/2002 Hernandez .................. 333/171
6,674,321 B1 * 1/2004 York ........................... 327/586
6,686,817 B1 * 2/2004 Zhu et al. .................... 333/205
6,690,251 B1 * 2/2004 Toncich ....................... 333/202
2002/0158717 A1 10/2002 Toncich

OTHER PUBLICATIONS

International Search Report and Written Opinion, PCT/US04/12475, Mar. 28, 2005.

* cited by examiner

Primary Examiner—Seungsook Ham
(74) Attorney, Agent, or Firm—Fenwick & West LLP

(57) ABSTRACT

A tuning circuit for use in an electrical circuit network is disclosed. The tuning circuit includes a bridge circuit. The bridge circuit comprises a first adjustable capacitance grouping, a second adjustable capacitance grouping and a third adjustable capacitance grouping. Each adjustable capacitance grouping includes at least one tunable capacitor and a bias port. In one embodiment, the tunable capacitor is comprised of a tunable thin-film barium strontium titanate ("BST") capacitor. A first lead and a second lead couple to, or extend from, the bridge circuit. The leads are configured to couple with a coupling element and a shunt element of the electrical circuit network so that when the leads are grounded, one adjustable capacitance group is grounded and the remaining adjustable capacitance group couple with a bias voltage to appropriately tune the electrical circuit to achieve desired electrical characteristics.

34 Claims, 4 Drawing Sheets

TUNABLE BRIDGE CIRCUIT

CROSS-REFERENCE TO RELATED APPLICATIONS

This application claims a priority benefit under 35 U.S.C. § 119(e) to U.S. Provisional Patent Application Ser. No. 60/464,675, filed Apr. 21, 2003, the contents of which are herein incorporated by reference.

This application is related to U.S. patent application Ser. No. 10/144,185, "Voltage-Variable Capacitor with Increased Current Conducting Perimeter," by Robert A. York, filed May 10, 2002, now U.S. Pat. No. 6,683,341, which claims priority under 35 U.S.C. § 119(e) to U.S. Provisional Patent Application Ser. No. 60/337,364, "Ferroelectric Varactor Design," by Robert A. York, filed Dec. 5, 2001; and is related to U.S. patent application Ser. No. 10/211,765, "Circuit Configuration for DC-Biased Capacitors," by Robert A. York, filed Aug. 1, 2002, now U.S. Pat. No. 6,674,321, which claims priority under 35 U.S.C. § 119(e) to U.S. Provisional Patent Application Ser. No. 60/335,191, "Thin-Film Ferroelectric Tuning Circuit," by Robert A. York, filed Oct. 31, 2001. The appropriate subject matter of all of the foregoing is incorporated herein by reference in its entirety.

BACKGROUND OF THE INVENTION

1. Field of the Invention

This invention generally relates to tuning an electrical circuit network, and more particularly, to a tuning circuit for the electrical circuit network.

2. Description of the Related Art

Circuit technology for use as a filter or other tuning mechanism for an electrical circuit is known. A basic filter for an electrical circuit is a well-known resistive-capacitive ("RC") circuit, inductive-capacitive ("LC") circuit or resistive-inductive-capacitive ("RLC") circuit.

Electrical filters and matching networks are frequently constructed as a "ladder" network. The ladder network consists of a number of shunt circuit elements that are electrically interconnected using series coupling elements. The shunt elements may be collections of reactive lumped elements such as resistors, capacitors, and/or inductors, or they may be distributed components such as small sections of transmission lines. The coupling elements may similarly be comprised of reactive lumped elements or transmission-line sections. The shunt elements and coupling elements may also be resonant or non-resonant, depending on the specific filter implementation and the desired electrical characteristics. For example, many bandpass filter designs use shunted short-circuited transmission-line resonators that are capacitively coupled together.

A problem with a conventional ladder network is that it is often sensitive to slight variations in any of its components values. For example, small deviations in any element value as a result of mechanical tolerances in the manufacturing process can degrade the electrical characteristics of the entire network. Another problem with a conventional ladder network is that it is often inflexible. Specifically, tuning the network is cumbersome and time-consuming because any changes to any element may result in changing the values of other elements to achieve the desired electrical characteristics.

Conventional solutions for tuning circuits may include use of a voltage-variable capacitor ("varactor") in the ladder network. A varactor adds flexibility for tuning a circuit because the capacitance can be tuned by changing a bias voltage across the capacitor. However, conventional varactors made from gallium arsenide ("GaAs") have relatively higher radio frequency ("RF") losses, poor power handling, poor intermodulation distortion ("IMD"), and are expensive to produce.

Therefore, there is a need for a tunable circuit that allows for adjusting circuit characteristics on an ad hoc basis and that allows for adjusting electrical characteristics so that a single network can be used for multiple functions. Moreover, from both manufacturing and operational standpoints, there is a need for a filter structure with adjustable component values that also has strong power handling capabilities and is relatively inexpensive to produce.

SUMMARY OF THE INVENTION

The present invention provides a tuning circuit for adjusting electrical characteristics in an electrical circuit network having at least one coupling element and at least one shunt element.

In one embodiment, a tuning circuit includes a bridge circuit configured to couple an electrical circuit, for example, a ladder network having a coupling element coupled with a shunt element. The bridge circuit includes a first adjustable capacitance grouping, a second adjustable capacitance grouping and a third adjustable capacitance grouping. Each adjustable capacitance grouping includes at least one tunable capacitor and a bias port. Connected with, or extended from, the bridge circuit are a first lead (or terminal or node) and a second lead. The leads are configured to couple the bridge circuit with an electrical circuit.

When one of the adjustable capacitance groups is at a direct current ("DC") ground potential, e.g., when a shunt element it couples with provides a DC path to ground, the other two adjustable capacitance groups may be isolated. This beneficially allows for application of a direct current ("DC") control voltage to the bias port of the respective other adjustable capacitance groups. In turn, this allows for appropriately adjusting the tuning capacitors in these adjustable capacitance groups to achieve the desired electrical characteristics.

In an alternative embodiment, a tunable capacitive bridge is configured to couple a ladder network. The ladder network includes a coupling element having a first side and a second side. The first side of the coupling element couples with a first shunt element and the second side of the coupling element couples with a second shunt element.

The tunable capacitive bridge that couples to this ladder network includes a first tunable capacitor, a second tunable capacitor, and a third tunable capacitor. The first tunable capacitor couples in parallel with the coupling element. In addition, a first end of the first tunable capacitor couples the first shunt element and a second end of the first tunable capacitor couples the second shunt element. The second tunable capacitor and the third tunable capacitor couple in parallel with the first tunable capacitor. A first end of the second tunable capacitor couples the first end of the first tunable capacitor and the first shunt element. A first end of the third tunable capacitor couples with the second end of the first tunable capacitor and the second shunt element.

In one embodiment, one or more of the tunable capacitors is a tunable thin-film barium strontium titanate ("BST") capacitor. The tunable thin-film BST capacitor may be a passive integrated circuit device that is capable of handling large voltage swings. Hence, the tunable thin-film BST capacitor configured within a tunable capacitive bridge in accordance with the present invention beneficially provides a mechanism for easily obtaining desired circuit characteristics. For example, tuning of electrical circuits such as ladder networks is accomplished by appropriately adjusting either the tunable capacitor in parallel with the coupling element or the tunable capacitors in parallel with the shunt elements. Thus, the electrical circuit is tuned without having to conduct undue experimentation involving identification and replacement of specific shunt elements to obtain desired characteristics for the electrical circuit.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1:
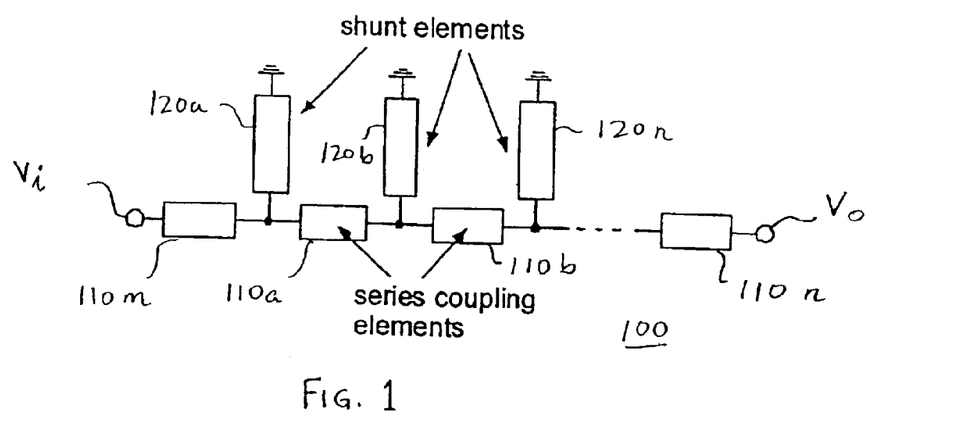
FIG. 1 is a circuit diagram of a conventional ladder network electrical circuit.

FIG. ("FIG.") 1 is a circuit diagram of a conventional ladder network electrical circuit 100. The ladder network includes a node for an input (e.g., Vi), an output (e.g., Vo or ground), one or more coupling elements 110 (e.g., 110a, 110a, 110b, ... 110m, 110n), and one or more shunt elements 120 (e.g., 120a, 120b ... 120n). Generally, the conventional ladder network includes the shunt circuit elements 120 configured to electrically interconnect through the series coupling elements 110.

As an example, in the conventional ladder network 100 illustrated in FIG. 1, the input, e.g., Vi, couples with an input coupling element 110m. The input coupling element 110m couples with a first shunt element 120a and a first coupling element 110a. The first coupling element 110a couples with the first shunt element 120a, a second shunt element 120b, and a second coupling element 110b. The second coupling element 110b couples with the second shunt element 120b, a third shunt element, e.g., 120n, and an output coupling element 110n. The output coupling element 110n couples with the third shunt element, e.g., 120n, and the output, e.g., Vo or ground. Each of the shunt elements 120 couples with ground.

It is noted that each coupling element 110 may be reactive lumped elements, for example, resistors, capacitors, and/or inductors. They may also be distributed components, for example, small sections of transmission lines. Similarly, the shunt elements 120 may also be reactive lumped elements or small section transmission lines. Each coupling element 110 and shunt element 120 may be either resonant or non-resonant. Use of resonant or non-resonant elements depends on a particular electrical circuit, e.g., filter implementation and desired electrical characteristics sought. For example, many bandpass filter designs use shunted short-circuited transmission line resonators that capacitively couple together.

As previously mentioned, electrical circuits constructed like the conventional ladder network electrical circuit 100 are sensitive to slight variations in element values. Small deviations in the element values, for example, as a result of mechanical tolerances in a manufacturing process, can degrade the electrical characteristics of the circuit. Hence, it may be advantageous to adjust the electrical characteristics so that a single network can be used for multiple functions, for example, tuning after manufacturing or during operation.

Figure 2:
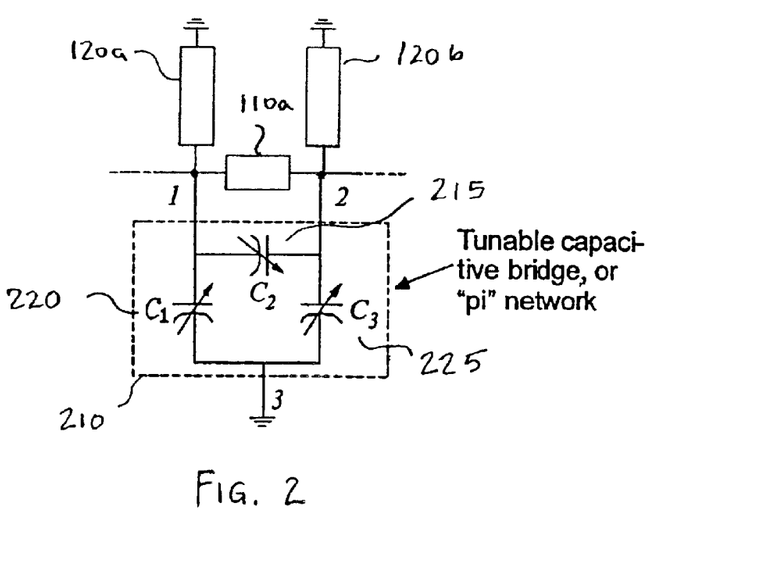
FIG. 2 is a circuit diagram of a tunable capacitive bridge coupled with a ladder network electrical circuit in accordance with one embodiment of the present invention.

FIG. 2 is a circuit diagram of a tunable capacitive bridge 210 coupled with an electrical circuit, e.g., a ladder network, in accordance with one embodiment of the present invention. In the illustrated embodiment, the tunable capacitive bridge 210 couples with a portion of the conventional ladder network electrical circuit 100 previously described. Specifically, the first end (e.g., terminal, node, or lead) of the tunable capacitive bridge (or "pi network") 210 couples with a first end of the first coupling element 110a and the first shunt element 120a, which also couples with ground. A second end (e.g., a terminal, node or lead) of the tunable capacitive bridge 210 couples with a second end of the first coupling element 110a and the second shunt element 120b, which also couples with ground.

The tunable capacitive bridge 210 includes a first tunable variable capacitor ($C_2$) 215, a second tunable variable capacitor ($C_1$) 220, and a third tunable variable capacitor ($C_3$) 225. Each tunable variable capacitor has a capacitance that can be tuned with a direct current ("DC") bias that is applied across each tunable variable capacitor individually. It is noted that a biasing circuit (not shown in FIG. 2) for use with the tunable capacitive bridge 210 is a conventional biasing circuit.

As an example, the first tunable variable capacitor C2 provides capacitance in parallel with the first coupling element 110a. By voltage-tuning capacitor C2, the total impedance of the coupling element 110a is proportionally changed. The second tunable capacitor C1 and the third tunable capacitor C3 provide an additional capacitance in parallel with the first shunt element 120a and the second shunt element 120b. By voltage-tuning the tunable variable capacitors C1 and C3, the total impedance of the shunt elements 120a, 120b is proportionally changed.

It is noted that the tunable capacitive bridge 210 of the present invention can be configured for tuning using the formulaic principles. Further, it is also noted that each tunable variable capacitor may be a varactor having an associated conventional biasing circuit (not shown). A varactor is a voltage-variable capacitor. This means that the capacitance of the varactor varies according to a DC bias voltage that is applied across that varactor.

Figure 3:
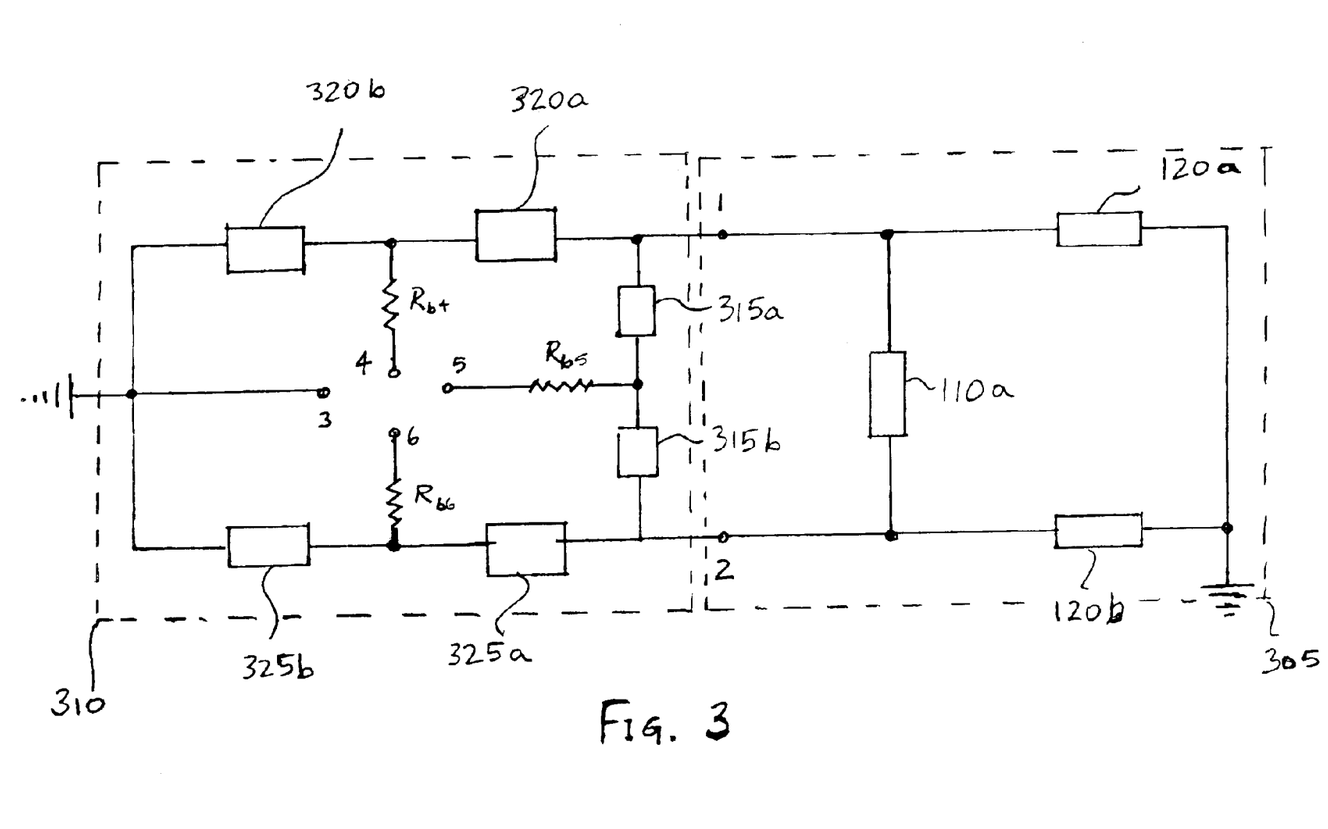
FIG. 3 is a circuit diagram of a tuning circuit coupled with a ladder network electrical circuit in accordance with one embodiment of the present invention.

Referring to FIG. 3, illustrated is a circuit diagram of a first embodiment of a tuning circuit 310 coupled with an electrical circuit 305 in accordance with one embodiment of the present invention. The electrical circuit 305 couples with the first embodiment of the tuning circuit 310 at a node 1 and a node 2. The electrical circuit 305 includes a coupling element, e.g., the first coupling element 110a previously described with respect to FIG. 1, coupled on each end (or side) with a shunt element, e.g., the first shunt element 120a and the second shunt element 120b previously described with respect to FIG. 1. In this exemplary embodiment, the first and the second shunt elements 120a, 120b couple in parallel with each other and the coupling element 110. The coupling element 110 also couples the first embodiment of the tuning circuit 310 in parallel.

The first embodiment of the tuning circuit 310 in FIG. 3 includes three reactance groups. Each reactance group includes reactance elements that may include a capacitor, an inductor and/or a resistor. FIG. 3 illustrates each reactance group as having two reactance elements, as is described below. Preferably, at least one reactance element is a variable reactance element. Moreover, although there are two reactance elements in each reactance group, the number of reactance elements can be varied to achieve desired electrical characteristics for a particular electrical circuit.

Turning now to each reactance group, the first reactance group includes elements between nodes (terminals or ports) 1 and 2. Specifically, this includes a first reactance element 315a and a second reactance element 315b. A first end of the first reactance element 315a couples with node 1 and a second end of the first reactance element 315a couples a first biasing circuit. A first end of the second reactance element 315b couples with node 2 and a second end of the second reactance element 315b couples with the first biasing circuit. The first biasing circuit includes a bias resistor, $R_{b5}$, and node 5. A biasing voltage, $V_{b5}$, can be applied to node 5 when nodes 1 and 2 provide a DC path to ground.

The second reactance group includes elements between nodes 1 and 3. Specifically, this includes a third reactance element 320a and a fourth reactance element 320b. A first end of the third reactance element 320a couples with node 1 and a second end of the third reactance element 320a couples a second biasing circuit. A first end of the fourth reactance element 320b couples with node 3 and a second end of the fourth reactance element 320b couples with the second biasing circuit. The second biasing circuit includes a bias resistor, $R_{b4}$, and node 4. A biasing voltage, $V_{b4}$, can be applied to node 4 when nodes 1 and 3 provide a DC path to ground.

The third reactance group includes elements between nodes 2 and 3. Specifically, this includes a fifth reactance element 325a and a sixth reactance element 325b. A first end of the fifth reactance element 325a couples with node 2 and a second end of the fifth reactance element 325a couples a third biasing circuit. A first end of the sixth reactance element 325b couples with node 3 and a second end of the sixth reactance element 325b couples with the third biasing circuit. The third biasing circuit includes a bias resistor, $R_{b6}$, and node 6. A biasing voltage, $V_{b6}$, can be applied to node 6 when nodes 2 and 3 provide a DC path to ground.

An advantage of the first embodiment of the tuning circuit 310 is that it allows for generation of higher power radio frequency ("RF") fields by keeping particular biasing voltages low and providing a DC path to ground for the appropriate associated nodes. Further, the first embodiment of the tuning circuit 310 also provides circuit tuning functionality for use in small form factor integrated passive devices as will be further described below.

Figure 4:
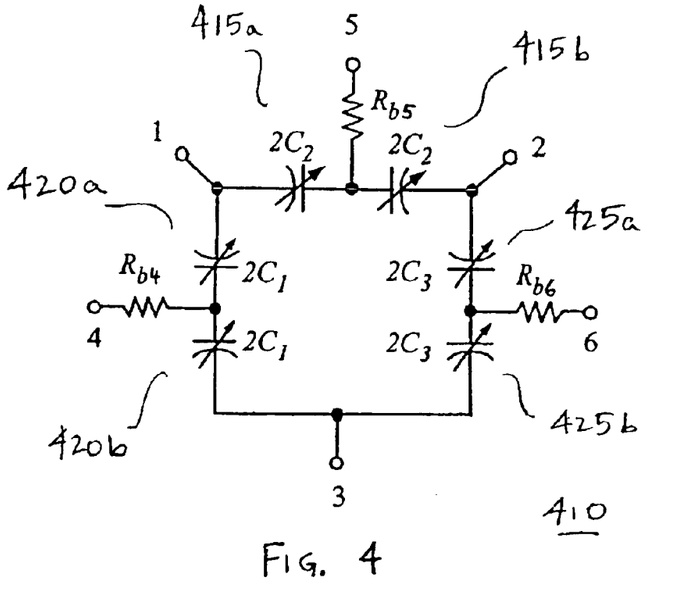
FIG. 4 is a circuit diagram of a tuning circuit comprised of tunable capacitors in accordance with one embodiment of the present invention.

FIG. 4 is a circuit diagram of a second embodiment of a tuning circuit 410 comprised of a plurality of tunable (or variable) capacitors in accordance with one embodiment of the present invention. The second embodiment of the tuning circuit 410 includes three tunable capacitance groups distributed between nodes 1 and 2, 1 and 3, and 2 and 3. The first tunable capacitance group, e.g., between nodes 1 and 2, includes a first tunable capacitor 415a, a second tunable capacitor 415b, and a biasing circuit of node 5. The biasing circuit of node 5 includes a biasing resistor, $R_{b5}$, and a node for application of a biasing voltage, $V_{b5}$. The first tunable capacitor 415a couples with node 1 and the biasing circuit of node 5. The second tunable capacitor 415b couples with node 2 and the biasing circuit of node 5.

Likewise, the second tunable capacitance group, e.g., between nodes 1 and 3, includes a third tunable capacitor 420a, a fourth tunable capacitor 420b, and a biasing circuit of node 4. The biasing circuit of node 4 includes a biasing resistor, $R_{b4}$, and a node for application of a biasing voltage, $V_{b4}$. The third tunable capacitor 420a couples with node 1 and the biasing circuit of node 4. The second tunable capacitor 420b couples with node 3 and the biasing circuit of node 4.

Similarly, the third tunable capacitance group, e.g., between nodes 2 and 3, includes a fifth tunable capacitor 425a, a sixth tunable capacitor 425b, and a biasing circuit of node 6. The biasing circuit of node 6 includes a biasing resistor, $R_{b6}$, and a node for application of a biasing voltage, $V_{b6}$. The fifth tunable capacitor 425a couples with node 2 and the biasing circuit of node 6. The second tunable capacitor 425b couples with node 3 and the biasing circuit of node 6.

Generally, the second embodiment of the tuning circuit 410 couples with an electrical circuit (e.g., 305) at, for example, nodes 1 and 2. In one operational embodiment of the third embodiment of the tuning circuit 410, nodes 1 and 2 are at a DC ground potential when the shunt elements, e.g., 120a, 120b, provide a DC path to ground. In this embodiment, DC control voltages applied to nodes 4, 5, and 6 can be isolated from an electrical circuit, such as an RF circuit. Examples of RF circuits with which the second embodiment of the tuning circuit 410 may couple with are disclosed in U.S. patent application Ser. No. 10/211,765, titled "Circuit Configuration for DC-Biased Capacitors" by Robert A. York and assigned to the same assignee as the present application, the relevant portions of which are herein incorporated by reference.

In addition, it is noted that in one embodiment, the second embodiment of the tuning circuit 410, the tunable capacitors of each tunable capacitance group have a one to one relationship. For example, the first tunable capacitor 415a and the second tunable capacitor 415b of the first capacitance group, the third tunable capacitor 420a and the fourth tunable capacitor 420b of the second capacitance group, and the fifth tunable capacitor 425a and the sixth tunable capacitor 425b of the third capacitance group each may have a value of $2 \times C_x$ (or $2C_x$). This would allow for the value of the capacitance for a particular capacitance group to be $2C_x + 2C_x = C_x$. It is noted that the value $C_x$ would be the same within each tunable capacitance group, but may differ between tunable capacitance groups. However, it is also noted that other capacitance values may apply within each tunable capacitor, as well as between tunable capacitance groups, to achieve the desired electrical characteristics for a particular circuit.

The second embodiment of the tuning circuit 410 is an attractive approach because it conveniently isolates the DC control voltages applied at nodes 4, 5, and 6 through respective bias resistors, $R_{b4}$, $R_{b5}$, and $R_{b6}$, from electrical circuits, e.g., an RF circuit. Moreover, the series combination of tunable capacitors allows for greater power handling. Power handling with regard to tunable capacitors is further described-in U.S. patent application Ser. No. 10/211,765, titled "Circuit Configuration for DC-Biased Capacitors" by Robert A. York and assigned to the same assignee as the present application, the relevant portions of which are herein incorporated by reference.

Figure 5:
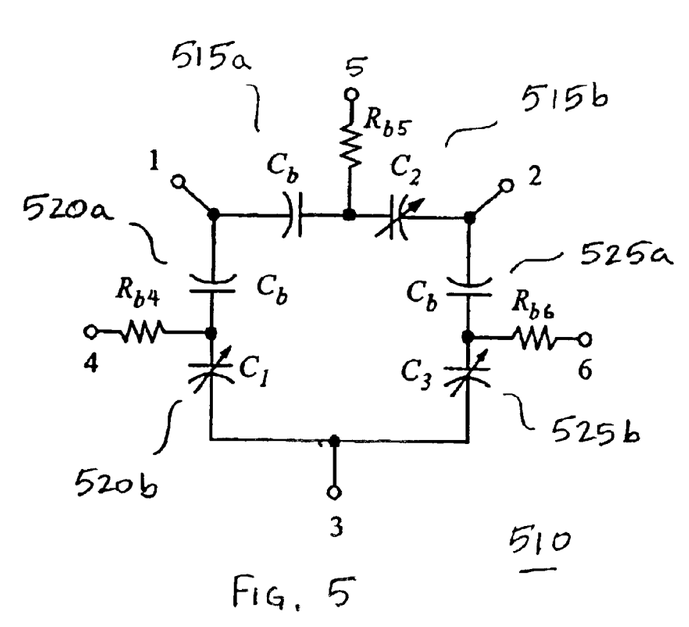
FIG. 5 is a circuit diagram of a tuning circuit comprised of bulk capacitors and tuning capacitors in accordance with one embodiment of the present invention.

FIG. 5 is a circuit diagram of a third embodiment of a tuning circuit 510 that includes bulk capacitors and tuning capacitors in accordance with one embodiment of the present invention. As with the second embodiment of the tuning circuit 410, the third embodiment of the tuning circuit 510 includes three tunable capacitance groups distributed between nodes 1 and 2, 1 and 3, and 2 and 3.

Each tunable capacitance group in the third embodiment of the tuning circuit 510 includes at least one tunable capacitor and a biasing circuit, similar to each capacitance group in the second embodiment of the tuning circuit 410. However, in the third embodiment of the tuning circuit 510, a fixed value capacitor (e.g., a bulk capacitor) replaces at least one tunable capacitor in each capacitance group. For example, fixed value capacitors, e.g., 515a, 520a, 525a, may be used in place of the first 415a, third 420a, and fifth 425a tunable capacitors described with regard to the second embodiment of the tuning circuit 410.

It is noted that in one embodiment, each fixed value capacitor 515a, 520a, 525a may be the same value, e.g., $C_x=C_b$. Alternatively, at least two of the fixed value capacitors may also differ in value in order to achieve desired electrical characteristics. The fixed value capacitors may be gallium arsenide capacitors that provide an alternative current ("AC") short condition when the value of the capacitor, $C_b$ is large. In addition, reducing the value of the capacitor, $C_b$, provides a greater Q factor. It is also noted that the third embodiment of the tuning circuit 510 allows for a circuit having greater tunability along with a higher Q factor.

Figure 6:
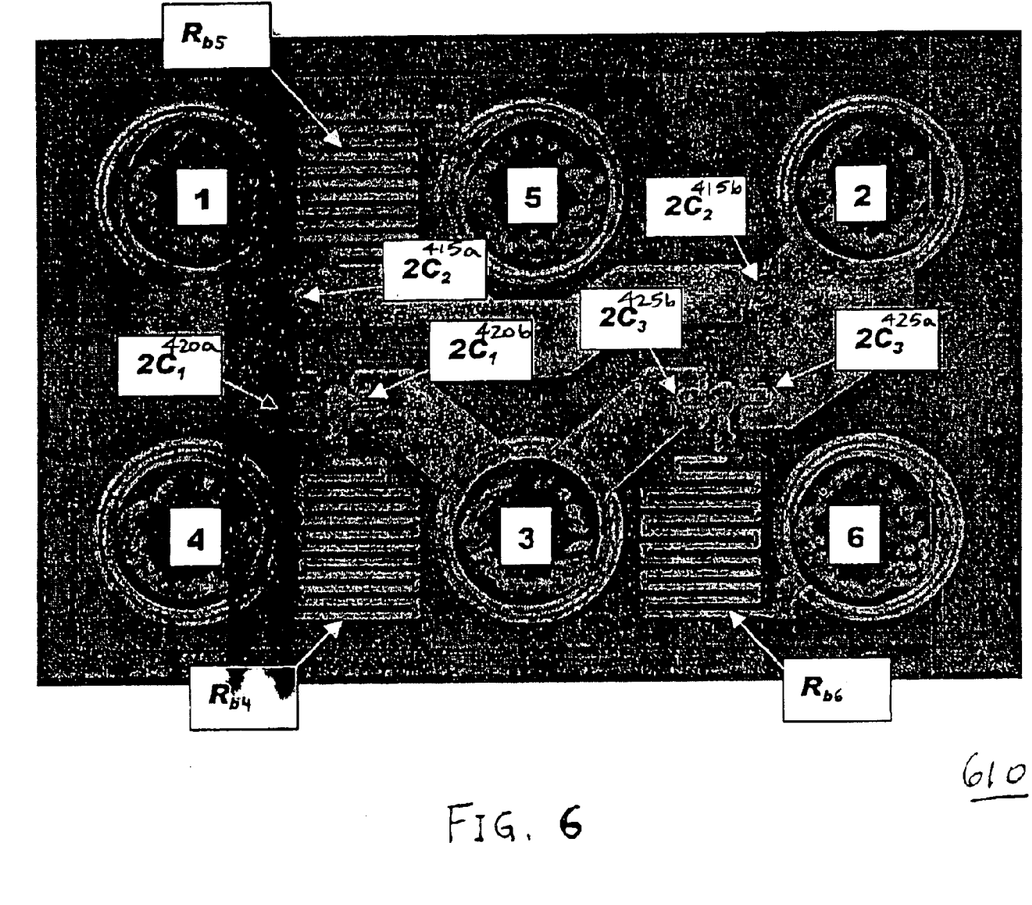
FIG. 6 is an illustration of a tuning circuit configured as an integrated passive device in accordance with one embodiment of the present invention.

Turning now to FIG. 6, it provides an illustration of the second embodiment of the tuning circuit 410 as it is configured as an integrated passive device 610 in accordance with one embodiment of the present invention. It is noted that the principles illustrated and described with regard to the second embodiment of the tuning circuit 410 in FIG. 6 also apply to the third embodiment of the tuning circuit 510, with the one tunable capacitor in each capacitance group being replaced with a fixed value capacitor as previously described. An advantage of the tuning circuits (including bridge circuits) as the integrated passive device 610 is that they allow for implementation in a small form factor. Hence, it offers benefits for small form factor devices and applications, for example, an RF circuit in a handheld communication device.

Further, in one embodiment of the present invention the integrated passive device 610 may be configured so that the capacitors may be barium strontium titanate ("BST") capacitors. Moreover the BST capacitor may be thin-film BST capacitors. In some applications, the BST capacitor has a fixed capacitance. One advantage of using BST as the dielectric material is that BST thin-film materials have a high intrinsic capacitance density. As a result, compared with other technologies, BST capacitors of a given capacitance can be realized with small active regions.

In other applications, the capacitance of the BST capacitor can be voltage-variable (e.g., a BST tunable (or variable) capacitor or BST varactor). The BST dielectric region can be voltage-variable because the BST dielectric material has a field-dependent electrical permittivity. Electrical permittivity, or tunability, is an electric field dependent property. Therefore, using BST thin films in a parallel plate capacitor configuration produces tunabilities with low control voltages (e.g., <20 volts) by maximizing field concentrations in the field.

Thus, changing the voltage applied across the BST dielectric region can change the capacitance of the tunable capacitor. For example, changing the voltage applied across the two electrodes, e.g., nodes 1 and 2, changes the electric field within the BST dielectric region of the tunable capacitor, e.g., 415b. This, in turn, changes the dielectric constant of the BST material, thus changing the capacitance of the tunable capacitor, e.g., 415b. The BST thin film dielectric region preferably exhibits a field-dependent permittivity in a (non-hysteretic) paraelectric state over a useful temperature range (e.g., −30C to +90C).

Examples of suitable BST thin film materials for dielectric region include barium titanate, strontium titanate, and composites of the two. For convenience, the term "BST" refers to all of these materials even though, strictly speaking, barium titanate does not contain strontium and strontium titanate does not contain barium. The BST materials can also include small concentrations of one or more dopants to modify certain properties.

To reduce costs, inexpensive insulating substrates are usually preferred, including but not limited to high-resistivity silicon (HR Si), crystalline sapphire ($Al_2O_3$), aluminum nitride (AlN), quartz and glass. These substrates are polished for low surface roughness for compatibility with growth of smooth ferroelectric films with high breakdown fields. This approach results in low-cost, small size, reliable components which are suitable for mass production and for integration with other circuit elements.

BST thin-film capacitors (including varactors) can be used in a variety of applications such as radio-frequency (RF) or wireless electronics, voltage-controlled oscillators, impedance matching networks, tunable filters, and numerous other applications. As one example application, BST varactors can be used in RC tuning circuits for RF applications, such as mobile phones. While specific numbers will vary by application, 2:1 capacitance variations and capacitances in the range of 0.01 pF to 10 nF are not unheard of. Similarly, DC control voltages may be in the range of −100 to +100 volts, depending on the BST film thickness and the specific application. The tunable capacitors (or varactors) preferably are operated at voltages that are less than half their intrinsic breakdown voltage.

A thin-film capacitor is attractive because it can be easily integrated alongside other active and passive electrical components on many different host substrates, including semiconductors (such as silicon, gallium arsenide, silicon carbide, gallium nitride, etc.) and insulators (such as glass, quartz, sapphire, etc.). However, processing steps for BST thin films can require conditions that limit the choice of materials for the electrodes and other structures.

As an example, the growth of BST thin films can require high temperature processing that limits electrode materials (at least for the materials that are present when the high temperature processing occurs) to those that have high melting points and that also do not oxidize easily. Examples of such materials include platinum and other refractory metals such as palladium and tungsten, but generally exclude commonly used conductors such as gold, copper and aluminum. Other suitable materials can include noble metals and conductive oxides. Unfortunately, materials such as platinum typically have higher resistivity and can also be quite expensive.

In some cases, the electrode can be shaped to reduce resistance. For example, an electrode that is narrow in the active region can open up into a wide area that has significantly less resistance compared to the narrow portion. Alternately, the electrodes can contact other layers that have better conductivity, for example thick gold layers that are formed after the BST processing steps are completed. Generally speaking, the fabrication process for BST capacitors, including even the order of processing steps, can affect the overall design, cost and performance of the capacitor.

Upon reading this disclosure, those of skill in the art will appreciate still additional alternative structural and functional designs for a tuning circuit, including a tuning circuit that includes a tunable thin-film BST capacitor, in accordance with the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A tunable capacitive bridge configured to couple a ladder network comprising coupling elements and a plurality of shunt elements, the tunable capacitive bridge comprising:
    a first tunable capacitor coupled in parallel with a coupling element, a first end of the first tunable capacitor coupled with a first shunt element and a second end of the first tunable capacitor coupled with a second shunt element; and
    a second tunable capacitor and a third tunable capacitor coupled in parallel with the first tunable capacitor,
        a first end of the second tunable capacitor coupled with the first end of the first tunable capacitor and the first shunt element, and
        a first end of the third tunable capacitor coupled with the second end of the first tunable capacitor and the second shunt element.

2. The tunable capacitive bridge of claim 1, wherein the second end of the second tunable capacitor couples with a ground.

3. The tunable capacitive bridge of claim 1, wherein the second end of the third tunable capacitor couples with a ground.

4. The tunable capacitive bridge of claim 1, wherein the first tunable capacitor comprises a thin-film barium strontium titanate ("BST") capacitor.

5. The tunable capacitive bridge of claim 1, wherein the second tunable capacitor comprises a thin-film barium strontium titanate ("BST") capacitor.

6. The tunable capacitive bridge of claim 1, wherein the third tunable capacitor comprises a thin-film barium strontium titanate ("BST") capacitor.

7. The tunable capacitive bridge of claim 1, wherein each of the first tunable capacitor, the second tunable capacitor, and the third tunable capacitor comprises a thin-film barium strontium titanate ("BST") capacitor.

8. The tunable capacitive bridge of claim 1, wherein at least one shunt element comprises a reactive element.

9. The tunable capacitive bridge of claim 1, wherein at least one shunt element comprises a small section transmission line.

10. A tunable capacitive bridge configured to couple a ladder network comprising a coupling element coupled with a shunt element, the tunable capacitive bridge comprising:
    a first tunable thin-film barium strontium titanate ("BST") capacitor coupled in parallel with the coupling element; and
    a second tunable thin-film BST capacitor and a third tunable thin-film BST capacitor coupled with the first tunable thin-film BST capacitor,
        a first end of the second tunable thin-film BST capacitor coupled with a first end of the first tunable thin-film BST capacitor, and
        a first end of the third tunable thin-film BST capacitor coupled with a second end of the first tunable thin-film BST capacitor.

11. The tunable capacitive bridge of claim 10, wherein the coupling element comprises one of a resonant and a non-resonant element.

12. The tunable capacitive bridge of claim 10, wherein the coupling element comprises at last one from a group consisting of a capacitor, inductor, a resistor, and a transmission line.

13. The tunable capacitive bridge of claim 10, wherein the shunt element comprises at least one from a group consisting of a capacitor, an inductor, a resistor, and a transmission line.

14. The tunable capacitive bridge of claim 10, wherein the second tunable thin-film BST capacitor and the third tunable thin-film BST capacitor couple with a ground.

15. The tunable capacitive bridge of claim 10, wherein the shunt element couples with a ground.

16. A tuning circuit comprising:
    a bridge circuit comprising
        a first adjustable capacitance grouping coupled between a first node and a second node,
        a second adjustable capacitance grouping coupled between the first node and a third node, and
        a third adjustable capacitance grouping coupled between the second node and the third node,
        wherein each adjustable capacitance grouping comprises at least one tunable capacitor coupled between a one of the nodes associated with that grouping and a bias port; and
    a first lead coupled to the first node and a second lead coupled to the second node, the leads configured to couple the bridge circuit with a coupling element coupled between the first node and the second node and with a shunt element coupled to a first end of the coupling element.

17. The tuning circuit of claim 16, wherein the tunable capacitor comprises a thin-film barium strontium titanate ("BST") capacitor.

18. The tuning circuit of claim 16, wherein at least one of the adjustable capacitance groupings further comprises a bulk capacitor coupled between an other of the nodes associated with the grouping and the bias port.

19. The tuning circuit of claim 18, wherein the tunable capacitor is set to a value substantially equivalent to the bulk capacitor in that adjustable capacitance grouping.

20. The tuning circuit of claim 16, wherein the bias port is configured to receive a bias voltage.

21. The tuning circuit of claim 20, wherein the bias port further comprises a bias resistance coupled between the tunable capacitor and the bias voltage.

22. A tuning circuit comprising:
    a bridge circuit comprising
        a first adjustable capacitance grouping coupled between a first node and a second node, a second adjustable capacitance grouping coupled between the first node and a third node, and a third adjustable capacitance grouping coupled between the second node and the third node, wherein each adjustable capacitance grouping comprises at least one tunable thin-film barium strontium titanate ("BST") capacitor coupled between a one of the nodes associated with that grouping and a bias port, the bias port configured to couple a bias voltage; and a first lead coupled to the first node and a second lead coupled to the second node, the leads configured to couple the bridge circuit with a coupling element coupled between the first node and the second node and with a shunt element coupled to a first end of the coupling element.

23. The tuning circuit of claim 22, wherein at least one adjustable capacitance grouping further comprises a bulk capacitor coupled between an other of the nodes associated with the grouping and the bias port.

24. The tuning circuit of claim 23, wherein the tunable BST capacitor is set to a value substantially equal to a value of the bulk capacitor in that adjustable capacitance grouping.

25. The tuning circuit of claim 22, wherein at least one adjustable capacitance grouping further comprises a second tunable thin-film BST capacitor coupled between an other of the nodes associated with the grouping and the bias port.

26. The tuning circuit of claim 25, wherein the second tunable thin-film BST capacitor is set to a value substantially equal to the at least one tunable thin-film BST capacitor in that adjustable capacitance grouping.

27. The tuning circuit of claim 22, wherein the bias port further comprises a bias resistor coupled between the tunable BST capacitor and the bias voltage.

28. A tuning circuit comprising:

a means for reactance adjustment within an electrical circuit, further comprising a first means for adjusting capacitance coupled between a first node and a second node, a second means for adjusting capacitance coupled between the first node and a third node, and a third means for adjusting capacitance coupled between the second node and the third node, wherein each means for adjusting capacitance comprises at least one means for capacitance having a high intrinsic capacitance density and a field-dependent electrical permittivity, the means for capacitance coupled between a first one of the nodes associated with the means for adjusting capacitance and a means for receiving a bias voltage; and a means for electrically coupling the means for reactance adjustment in parallel with a means for coupling and in series with a means for shunting in the electrical circuit.

29. The tuning circuit of claim 28, wherein the means for electrically coupling includes a first port coupling the means for reactance adjustment to the means for coupling and the means for shunting; and a second port coupling the means for reactance adjustment to the means for coupling.

30. The tuning circuit of claim 28, wherein the means for capacitance comprises a first tunable thin-film barium strontium titanate ("BST") capacitor.

31. The tuning circuit of claim 30, wherein at least one of the means for adjusting capacitance further comprises a second tunable thin-film BST capacitor coupled between a second one of the nodes associated with the means for adjusting capacitance and the means for receiving a bias voltage.

32. The tuning circuit of claim 31, wherein the second tunable thin-film BST capacitor is set to a value substantially equal to the first tunable thin-film BST capacitor in the means for adjusting capacitance.

33. The tuning circuit of claim 28, wherein the means for receiving a bias voltage further comprises a bias resistor.

34. A tunable capacitive bridge configured to couple a ladder network comprising a coupling element coupled in parallel with a shunt element, the tunable capacitive bridge comprising:

a first tunable thin-film barium strontium titanate ("BST") capacitor coupled in parallel with the coupling element and the shunt element; and a second tunable thin-film BST capacitor and a third tunable thin-film BST capacitor coupled in parallel with the first tunable thin-film BST capacitor and the coupling element and the shunt element, wherein the coupling element comprises at last one from a group consisting of a capacitor, inductor, a resistor, and a transmission line.

* * * * *